United States Patent
Imai et al.

(10) Patent No.: US 8,728,941 B2
(45) Date of Patent: May 20, 2014

(54) SEMICONDUCTOR APPARATUS AND MANUFACTURING METHOD OF SAME

(75) Inventors: Shigeki Imai, Osaka (JP); Takafumi Shimatani, Osaka (JP); Hikaru Kobayashi, Kyoto (JP)

(73) Assignees: Sharp Kabushiki Kaisha, Osaka-Shi (JP); Hikaru Kobayashi, Kyoto-Shi (JP)

( * ) Notice: Subject to any disclaimer, the term of this patent is extended or adjusted under 35 U.S.C. 154(b) by 90 days.

(21) Appl. No.: 13/634,784

(22) PCT Filed: Mar. 2, 2011

(86) PCT No.: PCT/JP2011/054804
§ 371 (c)(1),
(2), (4) Date: Sep. 13, 2012

(87) PCT Pub. No.: WO2011/114890
PCT Pub. Date: Sep. 22, 2011

(65) Prior Publication Data
US 2013/0005107 A1   Jan. 3, 2013

(30) Foreign Application Priority Data

Mar. 16, 2010  (JP) ................................. 2010-058973
Jun. 11, 2010  (JP) ................................. 2010-133474

(51) Int. Cl.
*H01L 21/302*  (2006.01)
*H01L 21/461*  (2006.01)

(52) U.S. Cl.
USPC ............. 438/689; 438/745; 438/756; 216/83; 216/103; 134/1.2; 134/3

(58) Field of Classification Search
USPC ............. 438/689, 745, 756; 134/1.3, 2, 3, 28; 216/83, 96, 97, 99, 100, 103, 106; 510/181, 175, 178
See application file for complete search history.

(56) References Cited

U.S. PATENT DOCUMENTS

| | | | |
|---|---|---|---|
| 5,985,740 A | 11/1999 | Yamazaki et al. | |
| 2004/0096797 A1 | 5/2004 | Yamazaki | |
| 2004/0099915 A1 | 5/2004 | Takayama et al. | |
| 2005/0181619 A1* | 8/2005 | Hwu et al. .................... | 438/745 |
| 2007/0117284 A1 | 5/2007 | Imai et al. | |
| 2011/0006310 A1 | 1/2011 | Nagasawa et al. | |

FOREIGN PATENT DOCUMENTS

JP   2004-56099 A   2/2004
JP   2005-311302 A  11/2005
(Continued)

*Primary Examiner* — Hsien Ming Lee
(74) *Attorney, Agent, or Firm* — Birch, Stewart, Kolasch & Birch LLP (57) ABSTRACT

Disclosed is a thin-film transistor (10) manufacturing method that includes a process for forming a nitrate film (12x) that includes residual nickel (22) on a surface thereof, by bringing a nitric acid solution into contact with a polysilicon layer (11x); and a process for removing the nitrate film (12x) that includes residual nickel (22) from the polysilicon layer (11x) surface. With this surface treatment process, a polysilicon layer (11) with reduced concentration of a surface residual nickel (22) is provided, and a thin-film transistor (10) having excellent surface smoothness is attained.

4 Claims, 4 Drawing Sheets (a)

(b)

(c)

(56) References Cited

FOREIGN PATENT DOCUMENTS

| | | |
|---|---|---|
| JP | 2005-311303 A | 11/2005 |
| JP | 2005-311389 A | 11/2005 |
| JP | 2006-13530 A | 1/2006 |
| JP | 2007-243216 A | 9/2007 |
| JP | 2008-283001 A | 11/2008 |
| JP | 2009-123753 A | 6/2009 |
| JP | 2010-45204 A | 2/2010 |
| WO | WO 2005/078787 A1 | 8/2005 |
| WO | WO 2009/063844 A1 | 5/2009 |

\* cited by examiner

SEMICONDUCTOR APPARATUS AND MANUFACTURING METHOD OF SAME

TECHNICAL FIELD

The present invention relates to a semiconductor apparatus and manufacturing method of the same, more particularly, to a semiconductor apparatus having a surface-treated semiconductor substrate and manufacturing method of the same.

BACKGROUND ART

Cleaning the surface of a semiconductor is indispensable in manufacturing a thin-film transistor (TFT) and the like from a semiconductor. As cleaning methods, in the case of silicon (Si), for example, in addition to a processing method for semiconductor substrates that employs a hydrogen peroxide solution (hereinafter referred to as the RCA processing method) developed by W. Kern et al. in 1970, chemical etching that processes the surfaces with diluted hydrofluoric acid ($HF/H_2O$) and aqueous solution of ammonium fluoride ($NH_4F/HF/H_2O$) are used as known techniques.

However, while etching the silicon surface with ammonium fluoride ($NH_4F$) aqueous solution is effective for removing natural oxide films, further improvement is required in removal of contaminants or in particle elimination measures. Also, while progress from a step is the dominant approach in etching of a plane direction (111), etching also progresses from some terraces such that the terrace portion affected by this etching becomes rough. That is, due to the plane direction dependency of conventional chemical etching techniques, obtaining a smooth surface at the atomic level (few nm level) is difficult, and therefore a uniform and flat surface cannot be expected from a polysilicon and an amorphous silicon with non-uniform crystal surfaces.

As art relating to the present invention, the present inventors have found that a highly-uniform quality silicon dioxide ($SiO_2$) based oxide coating can be formed on a substrate surface using only a so-called chemical action of chemicals by immersing the silicon substrate in an oxidizing solution, for example, azeotropic nitric acid (concentration of 68%, boiling point of 120.7° C.), and have proposed to use this technique for gate insulators of TFT and the like (for example, the patent document 1).

Further, the present inventors have proposed a technique in which an oxide coating is formed on the surface of a polysilicon layer having a projection of as long as 100 nm in an azeotropic nitric acid and then the oxide coating is etched away such that the projection is reduced (patent document 2).

RELATED ART

Patent Documents

Patent document 1: Japanese Patent Laid-Open Publication No. 2005-311302
Patent document 2: Japanese Patent Laid-Open Publication No. 2008-283001

DISCLOSURE OF THE INVENTION

Object of the Invention

In the field of TFT, it is a major object to remove contaminants such as metal from the surface of the semiconductor to sufficiently clean the surface. However, as mentioned above, contaminants on a semiconductor surface cannot be sufficiently removed using the conventional chemical etching technique. Further, while a surface smoothness at the nm level is required from polysilicon and amorphous silicon with non-uniform crystal surfaces, flatness of such a level cannot be attained by a conventional surface treatment technique.

An object of the present invention is to provide a method for sufficiently removing metal catalyst and contaminants present at and near the semiconductor surface, and to provide a high performance semiconductor apparatus that has been removed of metal catalyst and the like. Further, another object of the present invention is to provide a method for uniformly smoothing the semiconductor surface at the level of several nm. Means below contribute to at least one of the objects mentioned above.

Means for Solving the Object

The inventors have found that removal of metal catalysts and contaminants is possible in addition to further improvement of semiconductor surface smoothness by forming an oxide coating on the semiconductor surface by chemical processing (oxidizing solution processing) most preferably at room temperature or around room temperature (less than 100° C.) and then removing the oxide coating (removal by chemical etching). Based on this knowledge, a semiconductor surface treatment method and a manufacturing method for making a semiconductor apparatus adopting the method is provided.

A method for manufacturing a semiconductor apparatus according to the present invention includes the steps of; preparing a semiconductor substrate containing at least a metal catalyst or a contaminant; and bringing the semiconductor substrate into contact with an oxidizing solution or gas to form an oxide film including at least a metal catalyst or a contaminant on the surface thereof.

The manufacturing method of semiconductor apparatus according to the present invention is particularly useful when polysilicon including nickel metal catalyst is used as the semiconductor substrate. By bringing the polysilicon including nickel into contact with oxidizing solution or gas to form an oxide film including nickel at the surface of the polysilicon and then removing this film, nickel can be efficiently removed from the surface and near the surface.

In the manufacturing method of semiconductor apparatus according to the present invention, the oxidizing solution or gas is preferably a nitric acid solution or gas generated from nitric acid. Further, the nitric acid concentration is preferably 68% by mass or more and 99% by mass or less. For example, an oxide film mainly made of silicon dioxide can be formed by chemical formation at a thickness of approximately 0.3 to 5 nm, for example, by immersing the semiconductor substrate in nitric acid so as to be in contact therewith for a short period of time of approximately 10 minutes at room temperature.

The manufacturing method of semiconductor apparatus according to the present invention includes a surface treatment process including the steps of: bringing a semiconductor substrate into contact with an oxidizing solution or gas to form an oxide film; and removing the oxide film from the surface of the semiconductor substrate; wherein the surface treatment process is repeated once or more such that a root-mean-square of the semiconductor substrate surface becomes at least four fifths or less of that before the surface treatment.

The manufacturing method of semiconductor apparatus according to the present invention may include the steps of preparing an oxide film including at least a metal catalyst or a contaminant on the semiconductor substrate in advance and bringing the semiconductor substrate from which the oxide film has been removed into contact with an oxidizing solution or gas to form a gate oxide film on the surface thereof; forming a gate electrode on the gate oxide film; and forming a source and a drain on the semiconductor substrate. Further, a step for forming an insulating film (for example, CVD) may be added such that an insulating film consisting of an oxide film formed by bringing the substrate into contact with an oxidizing solution or gas and an insulating film formed on this oxide film by CVD is made to function as a gate insulating film.

As mentioned above, according to the manufacturing method of semiconductor apparatus according to the present invention, in the case of a semiconductor substrate made of polysilicon and the like including at least a metal catalyst or a contaminant, forming an oxide film including the metal catalyst and the contaminant by bringing the substrate into contact with an oxidizing solution or gas of nitric acid and the like and then removing this oxide film by a surface treatment will make it possible to remove metal catalyst and contaminants such as nickel from the surface and near the surface of the semiconductor. Further, this surface treatment improves surface smoothness of the semiconductor substrate.

The above-mentioned removal of metal catalyst and contaminants and smoothing of the surface by surface treatment are considered to follow the mechanism as follows. With semiconductor substrates to be surface treated, in particular, polysilicon substrates formed by crystallization of silicon by laser annealing and the like, minute projections tend to form on the surface due to collisions occurring at the crystal grain boundary. In addition, metal catalysts and contaminants included in the semiconductor substrates, nickel, in particular, are considered to have a tendency to collect at the projection portion formed at the crystal grain boundary. Also, since this projection is minute ranging in the order of several nm to several tens of nm, oxidizing solution or gas tend to easily penetrate the projection portion and therefore oxidation of the projection portion tends to progress quickly. Thus, removal of the oxide film that has been formed not only reduces concentration of metal catalysts and contaminants on and near the semiconductor substrate but also smoothes the surface thereof.

The semiconductor apparatus according to the present invention includes a semiconductor substrate obtained by first forming on the surface thereof an oxide film including a metal catalyst or the like by bringing the semiconductor substrate containing at least a metal catalyst or a contaminant into contact with an oxidizing solution or a gas and then removing this oxide film such that a surface concentration of a metal catalyst or the like has been reduced; a gate insulating film formed on the semiconductor substrate with reduced surface concentration of a metal catalyst and the like; a gate electrode formed on the gate oxide film; and a source and a drain formed on the semiconductor substrate. The present semiconductor apparatus has reduced amount of metal catalyst and contaminants at the surface of the semiconductor substrate and therefore surface smoothness is improved. Accordingly, higher performance such as improvement of mobility and reduction of leakage current density, and reduction of voltage (for example, applied voltage between source and drain, reduction of gate drive voltage) can be expected.

The manufacturing method of a semiconductor apparatus according to the present invention may include the steps of bringing the semiconductor substrate containing at least a metal catalyst or a contaminant into contact with an oxidizing solution or gas to form an oxide film that functions as a gate oxide film on the surface thereof; forming a gate electrode on the gate oxide film; and forming a source and a drain on the semiconductor substrate. The semiconductor apparatus according to the present invention may include a semiconductor substrate formed thereon a gate oxide film including a contaminant by bringing the semiconductor substrate containing at least a metal catalyst or a contaminant into contact with an oxidizing solution or a gas; a gate electrode formed on the gate oxide film; and a source and a drain formed on the semiconductor apparatus.

The manufacturing method of semiconductor apparatus according to the present invention may include the steps of bringing the semiconductor substrate into contact with an oxidizing solution or gas to form a gate oxide film on the surface thereof; forming a gate electrode on the gate oxide film; and forming a source and a drain on the semiconductor substrate. Also, the semiconductor apparatus according to the present invention may include a semiconductor substrate having a gate oxide film on a surface thereof formed by bringing the semiconductor substrate into contact with an oxidizing solution or gas; a gate electrode formed on the gate oxide film; and a source and a drain formed on the semiconductor substrate. That is, the semiconductor apparatus and manufacturing method thereof may be applied when using semiconductor substrates not including a metal catalyst or a contaminant.

Effect of the Invention

With the manufacturing method according to the present invention, metal catalysts and contaminants present at and near the surface of the semiconductor substrate can be sufficiently removed, and at the same time minute projections present on the semiconductor substrate can be reduced and the surface of the semiconductor substrate can be uniformly smoothed in the order of several nm level.

Also, according to the semiconductor apparatus of the present invention, the amount of metal catalysts (nickel and the like) and contaminants at and near the surface of the semiconductor substrate is low and the surface smoothness is high. Therefore, surface level of the semiconductor substrate can be reduced to improve mobility of the charge and the performance of the semiconductor apparatus such as a TFT can be significantly improved.

BEST MODE FOR CARRYING OUT THE INVENTION

Now, modes for carrying out the semiconductor apparatus according to the present invention and the manufacturing method thereof will be described in detail with reference to the drawings. Description below will be given with reference to a polysilicon substrate (layer) containing nickel as a metal catalyst and thin-film transistor having the polysilicon substrate (layer), but the present invention is not limited thereto.

First Embodiment

Polysilicon substrate 9 and the manufacturing method thereof with reduced surface nickel concentration, which is a first embodiment, more particularly the surface treatment method for a polysilicon layer 11x, will be described in detail below with reference to FIGS. 1 through 3. Here, the polysilicon layer 11x (polysilicon substrate 9x) refers to a layer having a lot of residual nickel before being subjected to the surface treatment (hereafter, layers having a lot of residual nickel 22 in the surface shall be denoted by an "x"). Further, residual nickel 22 is assumed to include nickel compounds connected with silicon and nickel compounds weakly connected with or not connected with silicon.

First, configuration of a polysilicon substrate 9 will be described with reference to FIG. 1(c). As shown in FIG. 1(c), the polysilicon substrate 9 is a glass substrate 20 on which the polysilicon layer 11 has been formed. Ordinarily, a back coat layer 21, which is a laminated film consisting of silicon dioxide ($SiO_2$) and silicon nitride (SiN), is provided between the polysilicon layer 11, which is semiconductor substrate, and the glass substrate 20. This back coat layer 21 has the function to prevent impurities such as sodium (Na) from entering the polysilicon layer 11 from the glass substrate 20 during the laser annealing process and the like described hereinafter.

The polysilicon layer 11, which is a semiconductor substrate, is obtained by depositing amorphous silicon or microcrystalline silicon on the glass substrate 20 by vapor deposition (plasma CVD) and applying nickel (Ni) thereon as a metal catalyst, and then instantaneously heating locally by laser annealing method and the like to polycrystallize the silicon. When conducting this laser annealing, using nickel as the metal catalyst will yield a polysilicon layer 11 with large grains. Further, the nickel catalyst that has been applied becomes residual nickel 22 with the surface concentration of approximately $10^{12}$ (atoms/cm$^2$), for example. Surface nickel concentration of the polysilicon layer 11 will be described hereinafter.

Now, the surface treatment method of the polysilicon layer 11x will be described in detail with reference to FIGS. 1(a) through (c). FIG. 1(a) illustrates the polysilicon layer 11x formed on the glass substrate 20. First, the surface of this polysilicon layer 11x is cleaned with an appropriate known cleaning method (for example, an RCA processing method). Then, the substrate is immersed in a low-concentration diluted hydrofluoric acid solution for approximately 1 minute (hereinafter referred to as HF processing) to remove a natural oxide film that is assumed to be formed on the surface of the polysilicon layer 11x. Lastly, it is rinsed (cleaned) with ultrapure water for 5 minutes.

Figure 1:
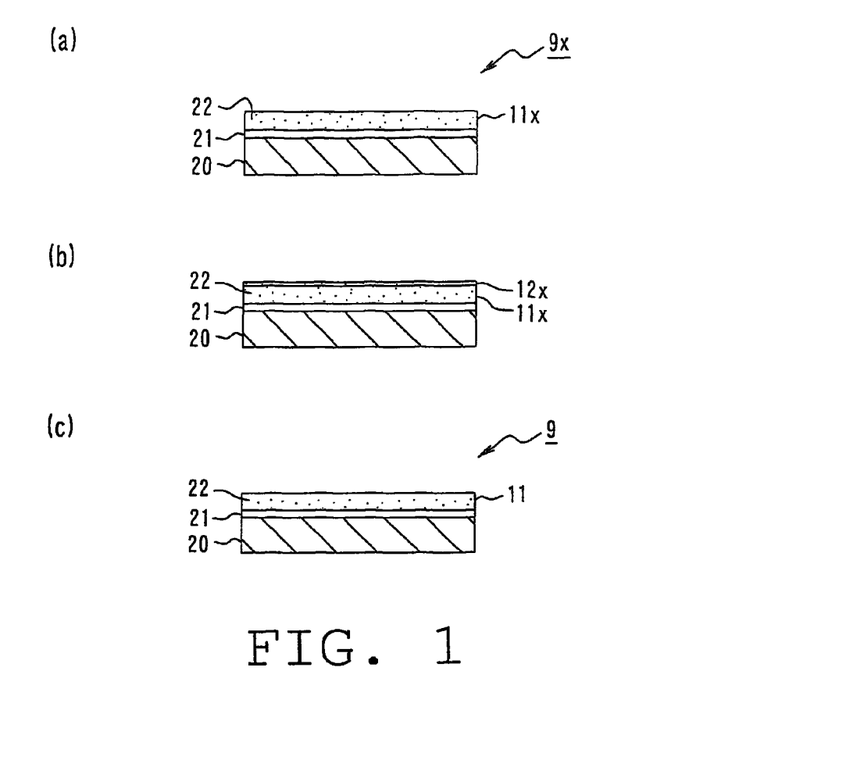
FIG. 1 is a schematic diagram illustrating a manufacturing method of a polysilicon substrate (surface treatment method of polysilicon substrate) according to the first embodiment of the present invention.

Next, the glass substrate 20 including the polysilicon layer 11x is immersed, for example, in a nitric acid aqueous solution with 70% by mass of nitric acid, for 10 minutes, for example, to form a nitrate film 12x on the surface of the polysilicon layer 11x as shown in FIG. 1(b) (hereinafter referred to as the nitric acid oxidation method). Here, while the concentration of the nitric acid aqueous solution may be arbitrarily changed, it should preferably be 68% by mass or more and 99% by mass or less. The temperature of the nitric acid aqueous solution should preferably be between room temperature and boiling temperature (for example, approximately 120° C.). Also, at least one oxidizing solution or a gas thereof selected from the group consisting of perchloric acid, sulfuric acid, and aqua regia may be arbitrarily used in place of nitric acid or in addition to nitric acid.

Nitrate film 12x is an $SiO_2$ film (chemically generated oxide film) with a thickness of an order of several nm with low leakage current and a low interface level. Further, nitrate film 12x contains residual nickel 22 present at and near the surface of the polysilicon layer 11x. The reason why the residual nickel 22 is easily included in the nitrate film 12x is that the residual nickel 22 has a tendency to collect at the projection portion on the surface, as mentioned above, and also assumed to be because the oxide film forms at a low temperature at which the residual nickel 22 does not move during the nitric acid oxidation method.

Then, the HF processing is performed again to etch away the nitrate film 12x including the residual nickel 22, as shown in FIG. 1(c). In FIG. 1, the surface of the polysilicon layer 11x has been shown flat for a schematic purpose, but in reality, there are minute projections around which the residual nickel 22 tend to collect.

As mentioned above, by forming the nitrate film 12x including the residual nickel 22 at and near the polysilicon layer 11x and performing a surface treatment to remove this nitrate film 12x, a portion of the residual nickel 22 can be effectively removed from the surface and near the surface of the polysilicon layer 11x. Accordingly, with the above-mentioned method, the polysilicon substrate 9 having reduced concentration of surface nickel can be obtained.

Figure 2:
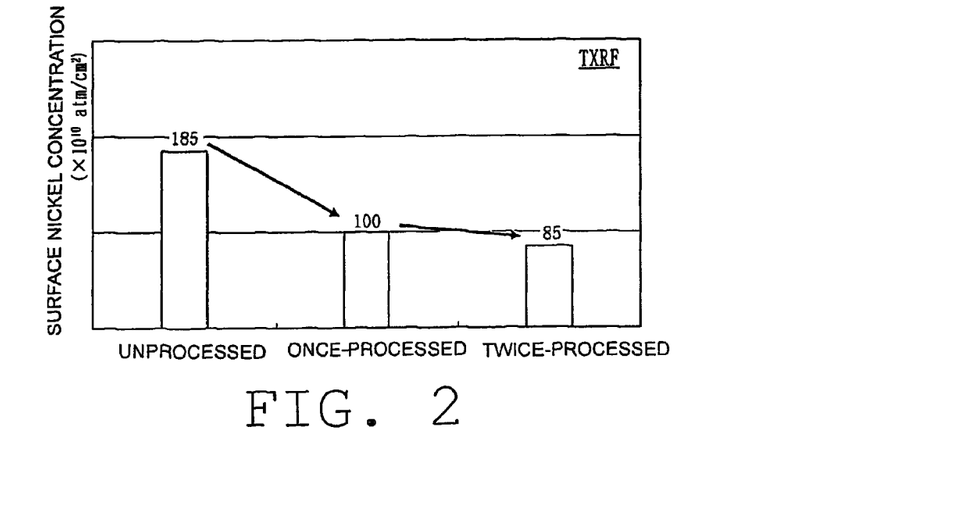
FIG. 2 is a diagram illustrating the relationship between the number of surface treatments and the surface nickel concentration in the polysilicon substrate according to the first embodiment.

Now, it will be shown that the residual nickel 22 is drastically reduced by the above-mentioned surface treatment, with reference to FIG. 2. FIG. 2 shows the surface nickel concentration on the polysilicon layer 11x quantitatively determined using total reflection X-ray fluorescence (TXRF). Surface nickel concentration was compared using one unprocessed sample that has not gone through cleaning and HF processing, another sample, or a once-processed sample, that has been immersed in a low-concentration diluted hydrofluoric acid solution for approximately one minute to remove natural oxide film (HF processing) and on which the nitrate film 12x was then formed to be further subjected to a surface treatment to etch away the nitrate film 12x, and then still another sample, or a twice-processed sample, that has been subjected to a second surface treatment.

As shown in FIG. 2, while the surface nickel concentration of the unprocessed sample was 185 ($\times 10^{10}$ atm/cm$^2$), just one processing reduced the surface nickel concentration to 100 ($\times 10^{10}$ atm/cm$^2$), and it can be seen that the residual nickel 22 on the surface has been reduced to half.

Further, as a result of observing the surface condition of the above-mentioned once-processed sample with an atomic force microscope (AFM), it was found that the surface smoothness had been significantly improved. FIG. 3 shows the surface condition measured by the AFM. FIG. 3 also shows the above-mentioned unprocessed sample and the HF processed sample obtained by subjecting the unprocessed sample to HF processing for comparison.

Figure 3:
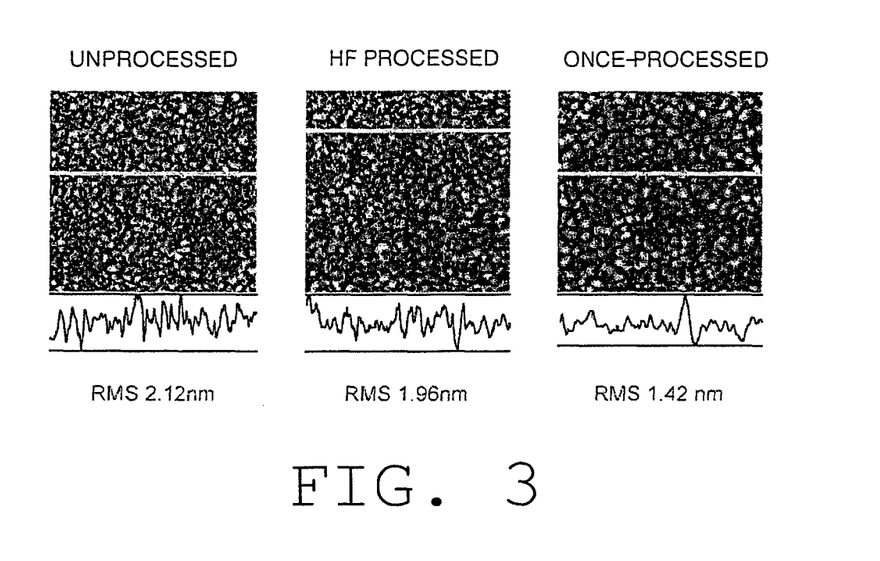
FIG. 3 is a diagram illustrating the surface state observed by an atomic force microscope in a polysilicon substrate according to the first embodiment.

As shown in FIG. 3, with the surface roughness of the unprocessed sample observed by the AFM expressed as a mean using the root-mean-square method being a root-mean-square roughness (RMS value) of 2.12 [nm], whereas the RMS value for the HF processed sample was 1.96 [nm], showing only a small change, the RMS value of the once-processed sample was significantly reduced to 1.42 [nm], showing that the surface has definitely been smoothed. The improvement in the RMS value differs to a certain degree depending on the initial roughness level, but it may improve down to ⅘ to ⅗ of the value before surface treatment by performing one surface treatment.

Second Embodiment

Figure 4:
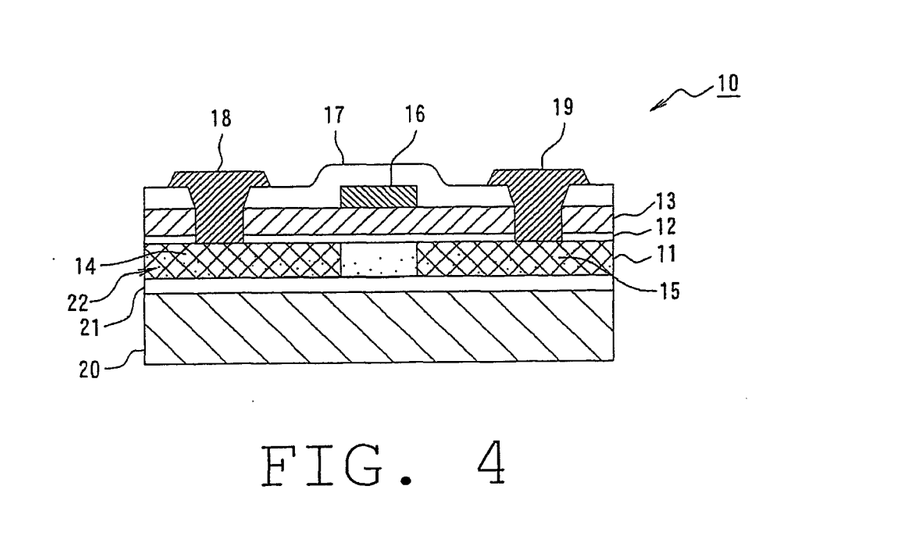
FIG. 4 is a cross sectional view schematically illustrating the configuration of a thin-film transistor according to the second embodiment of the present invention.
Figure 5:
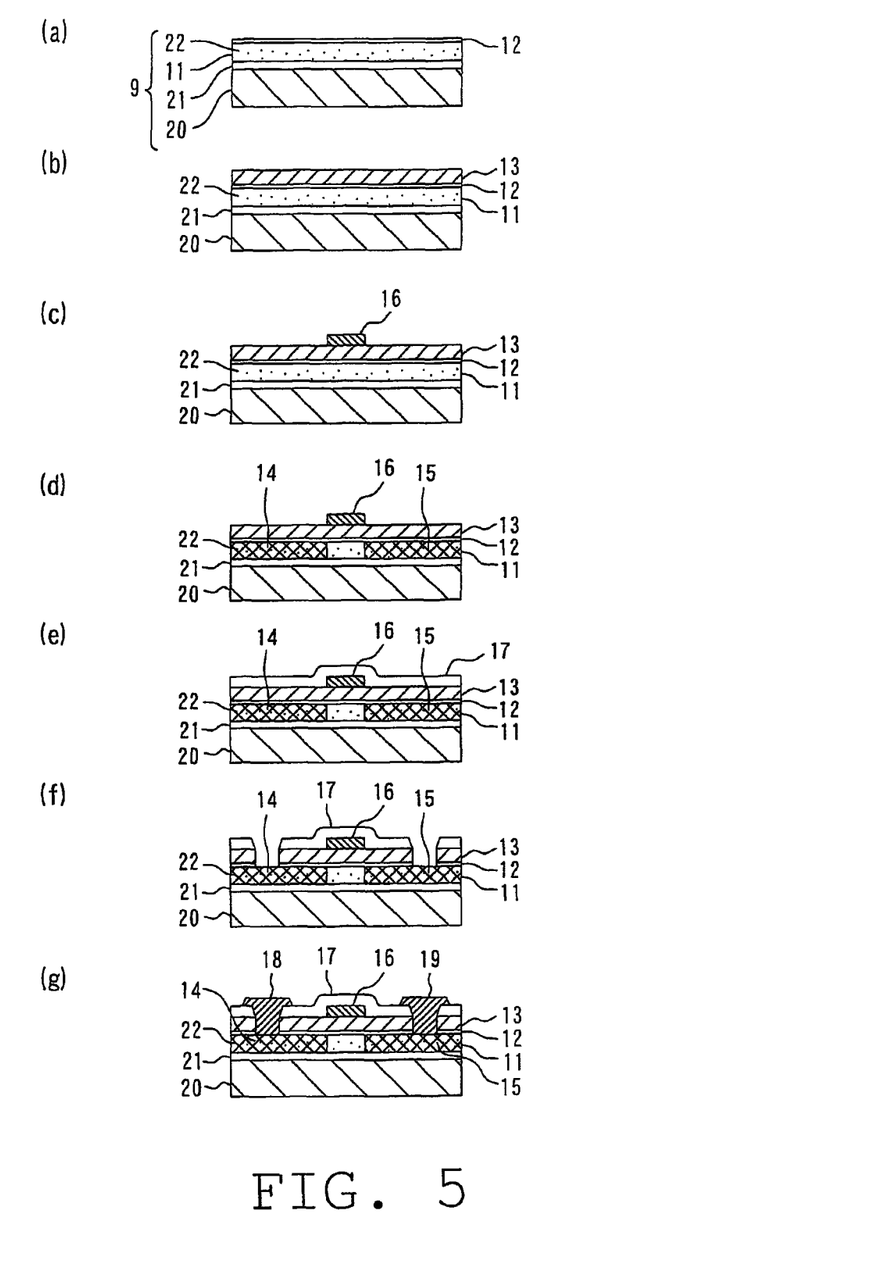
FIG. 5 is a schematic diagram illustrating a manufacturing method of a thin-film transistor according to the second embodiment of the present invention.

Referring to FIG. 4 and FIG. 5, a thin film transistor 10 (hereinafter referred to as the TFT 10), which is a second embodiment, will be described in detail hereinafter. The same components will be denoted by the same reference numbers and overlapping description thereof will be omitted (the same holds true for the third embodiment).

As shown in FIG. 4, the TFT 10 includes a polysilicon layer 11 formed on a glass substrate 20 via a back coat layer 21, that is, a polysilicon substrate 9, and a nitrate film 12 and a CVD insulating film 13 formed on the polysilicon layer 11. Here, the nitrate film 12 is, as mentioned above, an $SiO_2$ film formed by bringing the polysilicon layer 11 into contact with nitric acid aqueous solution, which is an oxidizing solution, and the CVD insulating film 13 is an insulating film such as the $SiO_2$ film formed by a common plasma CVD method.

The TFT 10 uses the nitrate film 12 and the CVD insulating film 13 as gate insulating films, and is provided with a source region 14 and a drain region 15 formed on the polysilicon layer 11, a gate electrode 16 formed on the CVD insulating film 13, an interlayer 17, a source electrode 18 and a drain electrode 19 provided in contact holes formed in the gate insulating film. In other words, the TFT 10 is a MOS type transistor.

Now, a manufacturing method of the TFT 10 will be described with reference to FIG. 5. Though not shown in FIG. 5, first, the polysilicon layer 11x formed on the glass substrate 20 is surface treated to prepare the polysilicon substrate 9 having a polysilicon layer 11 with reduced surface nickel concentration (refer to FIG. 1).

As shown in FIG. 5(a), the nitrate film 12 is formed on the surface of the polysilicon layer 11 by immersing thus obtained polysilicon substrate 9 again in an aqueous solution with a concentration of 70% by mass of nitric acid for 10 minutes. The newly formed nitrate film 12 here is an oxide film mainly composed of $SiO_2$ that is dense with a thickness of the order of several nm and that realizes low leakage current and a low interface level.

Next, as shown in FIG. 5(b), the CVD insulating film 13 is formed on the nitrate film 12 by a common plasma CVD method to obtain the gate insulating film having a thin nitrate film 12 and a thick CVD insulating film 13 laminated. Thickness of the CVD insulating film 13 is, for example, approximately 40 nm. Since the nitrate film 12 is a dense film with low leakage current and interface level, as mentioned above, the thickness of the gate insulating film which is ordinarily necessary to be as thick as 80 nm, it can be made as thin as approximately 40 nm. Further, a predetermined amount of impurities are doped at a low concentration to the channel portion of the polysilicon layer 11, as necessary, for threshold voltage control.

Next, after forming a conductive film on the gate insulating film by sputtering and the like, photolithography processing is performed to eliminate unnecessary portions, the process consisting of application of photoresist, exposing the pattern, development, and etching to form the gate electrode as shown in FIG. 5(c). Then, the gate electrode 16 that has been formed is used as a mask to dope such donors as phosphorus and arsenic by self alignment to form a source region 14 and a drain region 15 in the polysilicon layer 11, as shown in FIG. 5(d).

Next, as shown in FIG. 5(e), after forming an interlayer 17 that covers the gate electrode 16, a portion of the interlayer 17 and the gate insulating film is etched away to form a contact hole as shown in FIG. 5(f). Then, after forming a conductive layer by sputtering and the like, unnecessary portions are etched away by photolithography process to form a source electrode 18 and a drain electrode 19 in the contact holes to obtain the TFT 10 which is an N-channel MOS type semiconductor apparatus, as shown in FIG. 5(g) and FIG. 4.

While an N-channel MOS type semiconductor apparatus had been shown as an example above, a P-channel MOS type semiconductor apparatus, can be manufactured similarly. Also, an N-channel MOS type semiconductor apparatus and a P-channel MOS type semiconductor apparatus may be used to manufacture a CMOS type semiconductor apparatus. Further, low-concentration dopant may be doped and a high-concentration dopant may be doped using a spacer provided in the gate electrode to manufacture an LDD structure semiconductor.

The thus manufactured TFT 10 is provided with a polysilicon layer 11 from which the residual nickel 22 has been removed from the surface and near the surface thereof, and a nitrate film 12, dense and having low leakage current and low interface level, as a gate insulating film, meaning that further improved transistor characteristics such as improvement of mobility, reduction of current density, and reduction of TFT driving voltage can be expected over a TFT 50 to be described later. The formation of an oxide film by nitric acid oxidation method and the surface treatment method for removing the same is effective for the removal of metal catalysts or contaminants other than nickel, for example, copper (Cu) and iron (Fe).

Third Embodiment

A thin film transistor (referred to as the TFT 50), which is a third embodiment, will be described in detail hereinafter, with reference to FIGS. 6 through 8.

Figure 6:
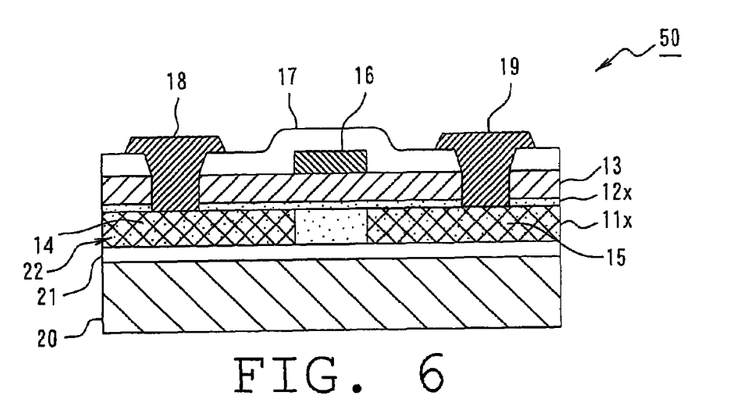
FIG. 6 is a cross sectional view schematically illustrating the configuration of a thin-film transistor according to the third embodiment of the present invention.

As shown in FIG. 6, besides the fact that the nitrate film 12x including the residual nickel 22 was formed on the surface of the polysilicon layer 11, and this nitrate film 12x was used as the gate insulating film without being removed, other components are similar to those of the thin film transistor 10. That is, the TFT 50 is obtained by a manufacturing method similar to that of the TFT 10 except for the fact that the surface treatment process of FIGS. 1(b) and (c) is excluded. In this case, preferably the residual nickel 22 is reduced by techniques such as gettering.

Now, the characteristics of the TFT 50 are described with reference to FIGS. 7 and 8. In the manufacturing process of the TFT 50, donor atoms and acceptor atoms were doped respectively to form two types of TFT, a P-channel TFT 50 (hereinafter referred to as the P-chTFT) and an N-channel TFT (hereinafter referred to as the N-chTFT) on the same glass substrate 20 to evaluate their characteristics. That is, the TFT 50 is a CMOS type semiconductor apparatus.

Figure 7:
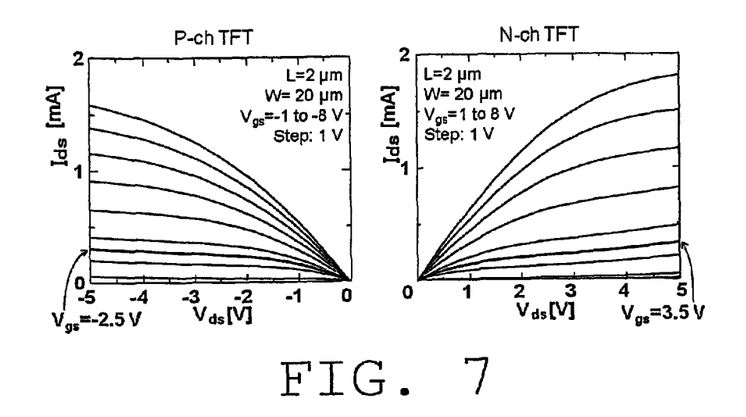
FIG. 7 is a characteristics chart illustrating the relationship between the drain voltage and the drain current of the thin-film transistor according to the third embodiment.

FIG. 7 is a characteristics chart illustrating the relationship between the drain voltage (Vds) [V] and the drain current (Ids) [mA]. FIG. 7 shows the characteristic curve obtained by applying gate-source voltage (Vgs) in steps of 1 volt [V] between 1 and 8 [V], and the characteristic curve when Vgs=−2.5 V for P-chTFT, and when Vgs=3.5 V for N-chTFT are shown by bold lines, respectively. The size of the TFT 50 subjected to evaluation had a gate length (channel length) (L) of 2 [μm] and a gate width (W) of 20 [μm] in the case of both P-chTFT and N-chTFT. According to the characteristic curves in FIG. 7, drain current (Ids) is not generated when the gate voltage is not applied, and therefore it can be understood that the TFT 50 is an enhancement type.

Figure 8:
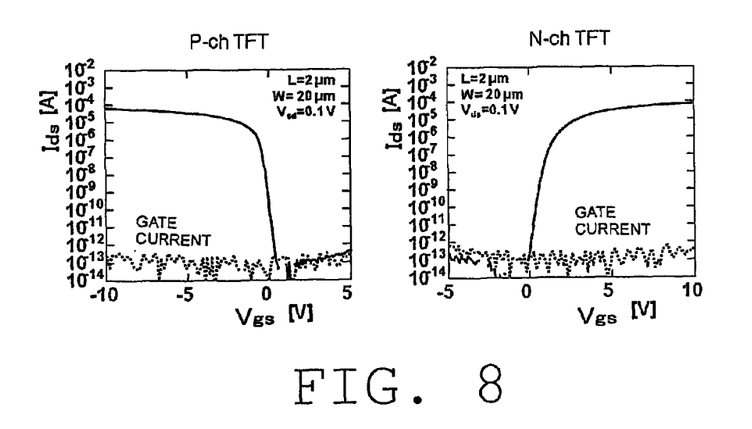
FIG. 8 is a characteristics chart illustrating the relationship between gate-source voltage and the drain current (solid line) and the gate current (dashed line) according to the thin-film transistor of the third embodiment.

FIG. 8 is a characteristics chart illustrating the relationship between gate-source voltage and the drain current (solid line), as well as the gate current (dashed line). Specifically, the solid line shows the relationship between gate-source voltage (Vgs) [V] and the drain current (Ids) [A] when the voltage between source electrode/drain electrode is set to 0.1V. The TFT 50 has almost no gate leakage current as shown by the dashed line, and as shown by the characteristic curve in solid line, it has been confirmed that it operates sufficiently at a voltage as low as 3 V.

While the CVD insulating film 13 had been described as having the thickness of 40 nm in the foregoing, thickness of the insulating film formed on the nitrate film 12 may be made, for example, 20 nm, or 10 nm, or less than 10 nm to realize a high-performance TFT capable of operating at a low voltage of 3V or less. More specifically, high-performance TFT can be realized such that the threshold voltage is approximately 0.2 to 1.0 in the case of the N-chTFT, and the threshold voltage is approximately −0.2 to −1.0 in the case of the P-chTFT. Further, the insulating film formed on the nitrate film 12 may be of a composition other than $SiO_2$, for example, high permittivity films such as SiON, SiN, and hafnium oxide (HfO).

Although the TFT formed on a glass substrate had been illustrated as an example in the above description, a flexible substrate may also be used instead of a glass substrate. Also, the TFT may be such that is used for a semiconductor apparatus of a three-dimensional structure formed by laminating on top of a substrate made of single-crystal silicon and the like. Further, the semiconductor substrate may be minute crystallized silicon and amorphous silicon.

Technical ideas of the present invention may also be applied to solar cells of single-crystal silicon, polysilicon, and the like.

INDUSTRIAL APPLICABILITY

The present invention may be applied to thin film semiconductor apparatus such as the TFT having silicon dioxide layer on the surface of the polysilicon layer and to the manufacturing method of the same. Further, such thin-film semiconductor apparatuses may be adopted in highly integrated functional devices such as a highly functional integrated circuit, a semiconductor memory device, and various liquid crystal displays.

DESCRIPTION OF THE REFERENCE NUMERALS

9, 9x polysilicon substrate, 10, 50 thin film transistor (TFT), 11, 11x polysilicon layer, 12, 12x nitrate film, 13 CVD insulating film, 14 source region, 15 drain region, 16 gate electrode, 17 interlayer, 18 source electrode, 19 drain electrode, 20 glass substrate, 21 back coat layer, 22 residual nickel

The invention claimed is:

1. A method for manufacturing a semiconductor apparatus, comprising the steps of:
    preparing a semiconductor substrate containing a metal catalyst;
    bringing the semiconductor substrate into contact with a nitric acid solution having a temperature in a range from room temperature to below 120° C., to form on a surface of the semiconductor substrate a nitric acid oxide film incorporating the metal catalyst that was present only on or near the surface of the semiconductor substrate; and
    after formation of the nitric acid oxide film, removing the nitric acid oxide film incorporating the metal catalyst from the surface of the semiconductor substrate without performing any thermal processing.

2. The method for manufacturing the semiconductor apparatus according to claim 1, wherein:
    the semiconductor substrate is made from polysilicon including nickel as a metal catalyst, and
    the nickel is removed from the surface of the semiconductor by removing the nitric acid oxide film including the nickel.

3. The method for manufacturing the semiconductor apparatus according to claim 1,
    wherein a surface treatment process including the formation and removal of the nitric oxide film is repeated once or more such that a root-mean-square of the semiconductor substrate surface becomes at least four fifths or less of that before the surface treatment.

4. The method for manufacturing the semiconductor apparatus according to claim 1, further comprising the steps of:
    bringing the semiconductor substrate, from which the nitric acid oxide film incorporating the metal catalyst has been removed, into contact with a nitric acid solution to form a gate oxide film on the surface thereof;
    forming a gate electrode on the gate oxide film; and
    forming a source and a drain on the semiconductor substrate.

* * * * *